United States Patent [19]
Gardell et al.

[11] Patent Number: 5,628,889
[45] Date of Patent: May 13, 1997

[54] HIGH POWER CAPACITY MAGNETRON CATHODE

[75] Inventors: David L. Gardell, Fairfax; David C. Strippe, Westford, both of Vt.

[73] Assignee: International Business Machines Corporation, Armonk, N.Y.

[21] Appl. No.: 301,203

[22] Filed: Sep. 6, 1994

[51] Int. Cl.$^6$ ................................................ C23C 14/34
[52] U.S. Cl. .................. 204/298.09; 204/298.19; 204/298.2
[58] Field of Search .................. 204/298.09, 298.12, 204/298.19, 298.2, 298.22, 192.12

[56] References Cited

U.S. PATENT DOCUMENTS

| | | | |
|---|---|---|---|
| 4,169,031 | 9/1979 | Brors | 204/192 R |
| 4,500,409 | 2/1985 | Boys et al. | 204/298 |
| 4,552,639 | 11/1985 | Garrett | 204/298 |
| 4,632,719 | 12/1986 | Chow et al. | 156/345 |
| 4,746,417 | 5/1988 | Ferenbach et al. | 204/298.2 |
| 4,826,584 | 5/1989 | dos Santos P. Ribeiro | 204/298 |
| 4,856,456 | 8/1989 | Hillman et al. | 118/500 |
| 4,872,964 | 10/1989 | Suzuki et al. | 204/298 |
| 4,885,075 | 12/1989 | Hillman | 204/298 |
| 4,906,347 | 3/1990 | Tomita et al. | 204/298 |
| 5,047,130 | 9/1991 | Akao et al. | 204/298.2 X |
| 5,082,545 | 1/1992 | Tanaka et al. | 204/298.03 |
| 5,130,005 | 7/1992 | Hurwitt et al. | 204/298.09 X |
| 5,171,415 | 12/1992 | Miller et al. | 204/298.09 X |

FOREIGN PATENT DOCUMENTS

| | | | |
|---|---|---|---|
| 215484 | 12/1984 | Japan | 204/298.09 |
| 312976 | 12/1988 | Japan | 204/298.09 |
| 1-279752 | 11/1989 | Japan | 204/298.2 |

OTHER PUBLICATIONS

W. C. Lester, "Cooling . . . Material", IBM Tech. Discl. Bulletin, vol. 20, No. 3, Aug. 1977, p. 1179.

"Centrifugal Pump with Auxiliary Impeller for Taking Suction on Shaft Side of Impeller Plate to Reduce Seal Leakage", IBM Tech. Bul. vol. 26, No. 2, Jul. 1983, pp. 758–759.

"Dielectric Coolant Pump", IBM Tech. Bul., vol. 14, No. 7, Dec. 1971.

*Primary Examiner*—Nam Nguyen
*Attorney, Agent, or Firm*—Calfee Halter & Griswold

[57] ABSTRACT

A high power capacity magnetron cathode has coolant fluid control surfaces attached to a supporting structure of a magnet array housed by a magnet array housing. The coolant fluid control surfaces provide radial and axial pumping and circulatory action of liquid coolant introduced into the magnet array housing throughout the housing and about the magnet array to significantly increase cooling efficiency by increasing distribution of coolant circulation. The fluid control surfaces may include fluid conductive vanes in patterns designed to maximize coolant flow. Fluid control surfaces and vanes are additionally provided on interior surfaces of the magnet array housing. The fluid control surfaces and vanes increase the surface area of the array and housing to increase the cooling action of the coolant at the bonding interface of cathode material to the magnet array housing, allowing the cathode to be operated at high power levels without thermal or pressure induced damage to the cathode bond. A non-flat configuration to the mating surfaces of the cathode material with the magnet array housing improves heat transfer away from the bonding layer of the cathode material.

18 Claims, 8 Drawing Sheets

HIGH POWER CAPACITY MAGNETRON CATHODE

FIELD OF THE INVENTION

The present invention relates generally to magnetron cathodes used in sputter deposition devices which apply material to a substrate within a vacuum cathode chamber by sputtering and, in particular, to sputtering devices having magnetron cathodes which are cooled by circulated liquid coolant.

BACKGROUND OF THE INVENTION

Magnetron cathode sputter deposition devices perform deposition of coatings to substrates by ejection of atoms or groups of atoms from the surface of a cathode in a vacuum by heavy-ion impact on the substrate to be coated with the material of the cathode. A magnet array is rotated over the substrate to create a dynamic pattern of magnetic flux over the substrate surface area covered by the array. The pattern of the magnet array is critical to obtaining a uniform deposition thickness of material upon the substrate. The substrate is disposed in a low pressure vacuum into which an inert gas is introduced. A reactive gas may be introduced into the chamber for reactive ion etching. An RF voltage is applied to the substrate holder to create an RF field between the substrate and the chamber. Electrons are removed from the substrate and ionize the gas. Gas ions impact the substrate dislodging atoms or molecules of the substrate material. The ions are generally produced by collisions of gas atoms and electrons in a glow discharge and are accelerated into the target substrate from the cathode with the aid of the electric field. The substrates, arranged in the vacuum chamber, catch the atoms knocked out of the target material and in this way are coated with the cathode material. Uniform etching can also be accomplished by use of a rotating magnet array in a similarly constructed etching device.

A fundamental performance deficiency of magnetron cathodes of sputtering devices is that the power dissipation capacity is limited by the geometry of the cathode supporting flange and heat generated at the cathode/flange interface. In general, increasing the electric field strength increases the material deposition rate on the substrate, thus reducing cycle time. Increasing the field strength also increases the heat flux power density at the cathode. Several variations to magnetron cathode configurations have been proposed to increase the power density of the cathode. For example, welding the cathode to the flange interface allows the cathode to withstand higher temperatures. Alternatively, the flange and cathode can be machined from a single piece of cathode material. This type of construction however is expensive and is not reworkable by addition of new cathode material. Another approach is to increase the flow of chilled water used as a coolant within the magnet array housing. This approach has had limited effect on power dissipation in practice. Higher water pressure inside the magnet array housing results in increased mechanical stress on the cathode material solder joint, offsetting the benefit of increased cooling action of the water.

The cathode material in the vacuum chamber is typically either in the form of a single piece housing around the magnet array, or attached by weld or solder to a mounting surface of a permanent housing around the magnet array which seals the magnet array from the vacuum chamber. When the cathode material of a single piece housing is expired, the entire housing assembly must be replaced. Because the entire housing must be constructed of ultra-pure cathode material, replacement of the housing is very expensive.

In a different cathode design wherein the cathode material is attached to a permanent housing, the cathode is reworked by welding or soldering on new cathode material. The bonding interface between the housing and the cathode material is typically a solder bond of, for example, Pb, In, Sn or Ag selected for adhesive and heat transfer properties. However, when this method of cathode attachment is used with relatively large wafers having power level densities on the order 200 watts/in$^2$, the interface material experiences delamination failures due to insufficient heat transfer. The larger surface area of large wafers creates excessive mechanical stress on the cathode plate/housing interface due to the presence of vacuum pressure on the target side and coolant pressure (typically on the order of 35–40 psi) on the inside of the housing.

The form of bonding of the cathode material to the housing must be able to withstand the heat generated in the ionization process. The cathode material and the bonding layer of the cathode to the housing are exposed to high temperatures, strong magnetic and electric fields and a high vacuum during sputtering. For this reason the interior of the housing and the magnet array is cooled by flooding with a fluid coolant, usually water.

The average maximum power density at the surface of the cathode presently is on the order of 100 watts/square inch. Increasing the power in permanent housing type cathodes can result in failure of the cathode bonding solder joint due to high temperatures and high thermal and mechanical stress. In order to achieve more efficient cooling, a higher velocity and flow rate of cooling fluid is required on the interior surfaces of the housing. Appropriate coolant circulation pressure is necessary. However, excessive coolant circulation pressure results in a relatively large difference between the pressure in the cooling chamber and the pressure in the vacuum chamber surrounding it, producing target distortion or ruptures in the target material or solder joint.

SUMMARY OF THE INVENTION

The present invention provides a unique cathode magnet array which has coolant fluid control surfaces for use in a high power capacity magnetron cathode. Fluid control surfaces on the bottom and/or side of a rotating magnet array induce controlled hydrodynamic flow of coolant within a magnet array housing to significantly increase cooling efficiency of the coolant upon the cathode. Interior surfaces of the magnet array housing may be provided with fluid control vanes configured to increase the convective surface area of the housing and to promote controlled hydrodynamic flow. The vanes on the interior walls of the housing may be in the form of radial ribs which increase the surface area of the cathode to be cooled.

In accordance with one aspect of the invention, a high power capacity magnetron cathode is provided which includes a cathode portion mounted upon a frame in a vacuum chamber of a sputter deposition device, the cathode including a rotatable magnet array mounted for rotation within a magnet array housing. The magnet array housing may be constructed of the cathode material to be deposited, or alternatively, a layer of cathode material may be attached to an exterior surface of the magnet array housing. The rotatable magnet array is provided with fluid control surfaces having fluid control vanes which operate to induce controlled dynamic flow of liquid coolant throughout the magnet array housing. The coolant conductive vanes on the interior of the magnet array housing increase the surface area of the housing, thereby increasing cooling efficiency and protecting the cathode bond to the housing. The housing vanes cooperate with the magnet array vanes to optimize coolant flow and efficiency.

In accordance with another aspect of the invention, a magnet array for use in a liquid cooled cathode of a sputtering device is provided which includes vanes which protrude from fluid control surfaces of the magnet array in defined patterns which enhance dynamic flow of coolant through a magnet array housing and about the magnet array, thereby increasing the cooling efficiency of the coolant and allowing the cathode to tolerate higher power levels without thermal or pressure induced failure.

In accordance with another aspect of the invention, a magnet array housing for a magnet array in a cathode of a sputtering device is provided which includes coolant fluid control vanes which protrude from interior surfaces of the housing in defined patterns which enhance dynamic flow of coolant through the housing and about the magnet to increase the surface area of the housing at the area of attachment of cathode material to improve the cooling efficiency of the coolant and allow the cathode bond to tolerate higher power levels.

In accordance with yet another aspect of the invention, a machined interface of a cathode plate and a magnet array housing has a complex geometry which improves heat transfer efficiency to maintain the bonding efficacy of a solder alloy glue layer which bonds the cathode to the housing.

To the accomplishment of the foregoing and related ends the invention then comprises the features hereinafter described in detail with reference to the figures and particularly pointed out in the claims, the following description setting forth in detail certain illustrative embodiments of the invention, these being indicative however of but a few of the various ways in which the principles and concepts of the invention may be employed.

DETAILED DESCRIPTION OF PREFERRED EMBODIMENTS

Figure 1:
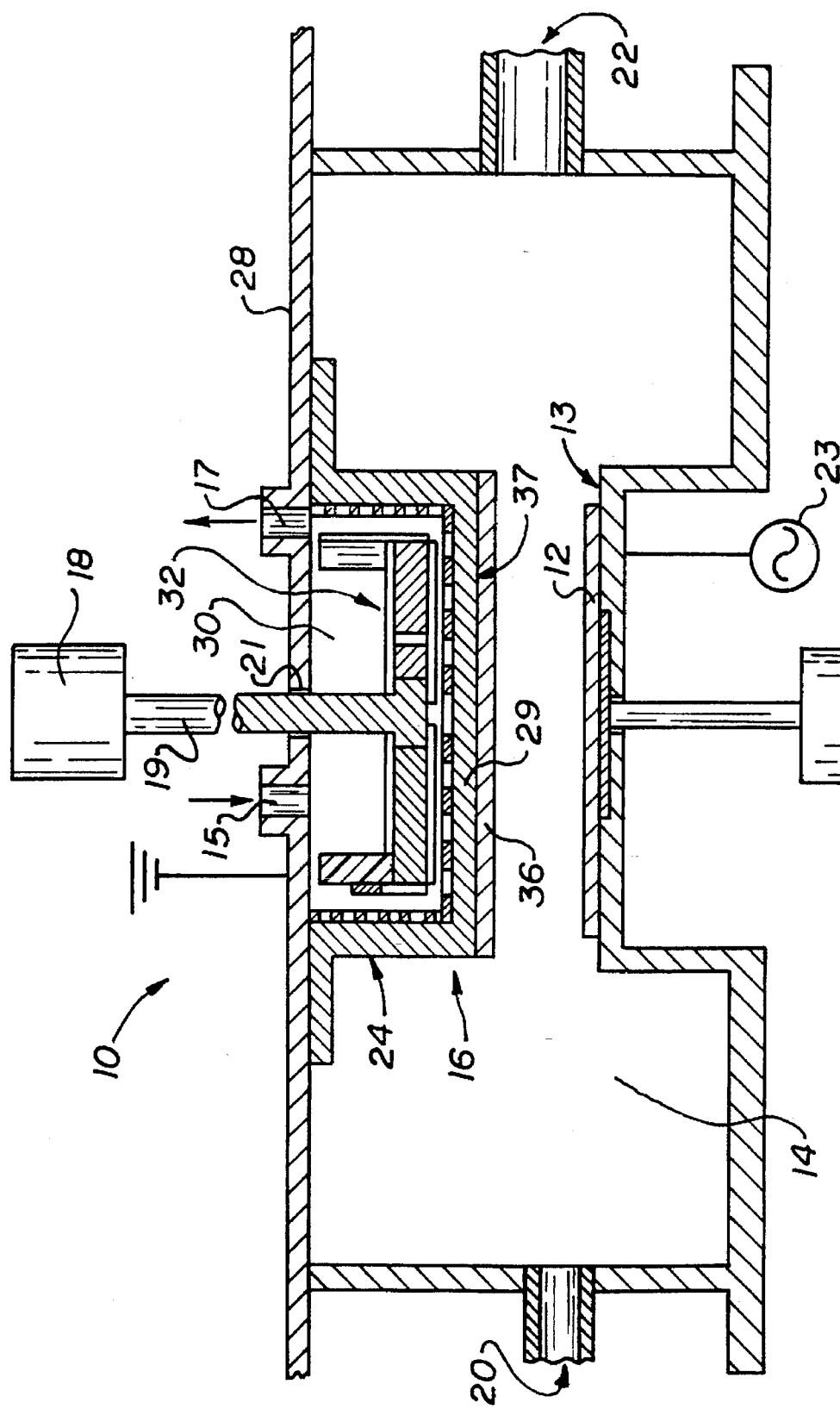
FIG. 1 is a schematic cross-section of a portion of a vacuum chamber portion of a sputtering device having a magnetron cathode of the present invention.

With reference to FIG. 1, there is illustrated in cross-section the reaction chamber/magnetron cathode portion, indicated generally at 10, of a sputtering device such as is commonly used in the manufacture of semiconductor devices by, for example, sputtered deposition of cathode material upon a substrate 12 (such as silicon oxide) positioned in a base area 13 of a vacuumized reaction chamber 14. A magnetron cathode, indicated generally at 16, includes a vacuum mount flange 24, positioned at an upper region of the reaction chamber 14 opposed to the substrate, which forms a magnet array housing 30 for a rotating magnet array 32. A layer of cathode material 36 is attached by solder or weld to a bottom exterior surface of the vacuum mount flange 24. The magnet array 32 is connected to a driver 18 for powered rotation by shaft 19 within the magnet array housing 30. A seal 21 about shaft 19 prevents coolant from escaping through the shaft hole in the magnet array housing.

The reaction chamber 14 further includes a reaction gas inlet port 20 and gas outlet port 22 to allow controlled injection and exhaust of reaction gas during the sputtering process. A voltage source 23 is connected to the base 13 of the reaction chamber 14. A horizontal frame section 28 covers the magnet array housing 30 and includes a coolant inlet port 15 and outlet port 17 by which coolant is circulated to flow through the housing and about the rotating magnet array 32 to cool the housing walls and, in particular, the housing wall to which the cathode material 36 is attached. The layer of cathode material 36 is attached by solder or weld (not shown) to an underside surface 37 of bottom plate 29 of vacuum mount flange 24. When the cathode material 36 is exhausted, a new layer is attached.

Figure 2:
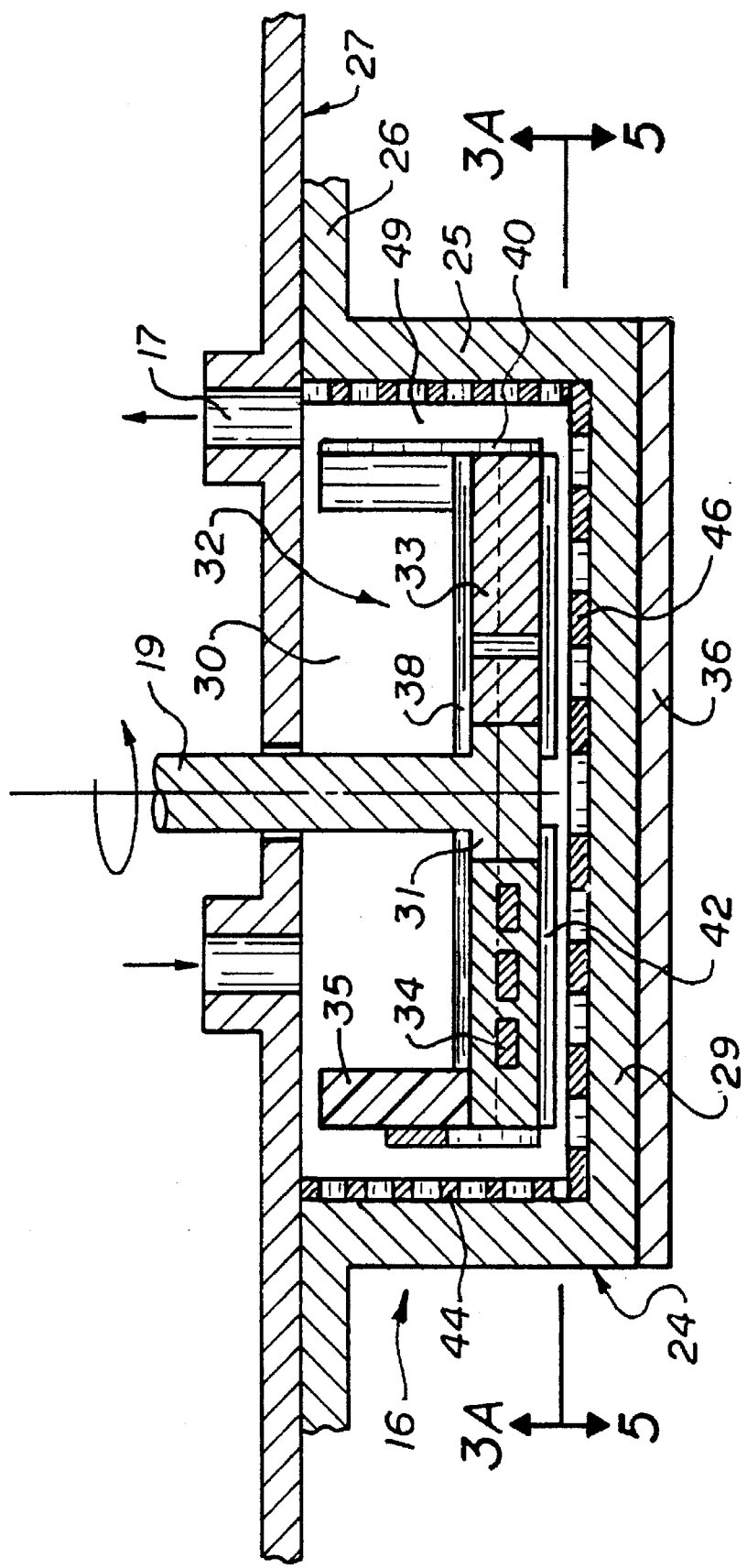
FIG. 2 is a partial cross-section, taken in the direction of arrows 2—2 in FIG. 3A, of a magnetron cathode portion of the present invention in a vacuum chamber of a sputtering device.

As shown in enlarged detail in FIG. 2, the magnetron cathode 16 includes a generally cup-shaped vacuum mount flange 24 which has an annular rim 26 secured to an underside 27 of a horizontal frame section 28 of the sputtering device, and a generally annular side wall 25 extending perpendicular from frame section 28, connected to a horizontal housing bottom plate 29. Securement of the vacuum mount flange 24 to frame section 28 creates a magnet array housing 30 of generally cylindrical configuration to receive and house a generally circular rotatable magnet array 32 and a portion of a magnet array shaft 19 attached to a horizontal magnet array support plate 31. The magnet array 32 includes, for example, a plurality of magnets 34 attached to the bottom of support plate 31 in an arrangement designed to optimize magnetic flux through the vacuum mount flange to the cathode material and upon the substrate. For example, U.S. Pat. No. 4,872,964 discloses one such arrangement of a plurality of specially dimensioned magnets in a rotatable array. The present invention is not limited to any particular shape or arrangement of magnets on a supporting structure of a rotatable array.

Figure 2A:
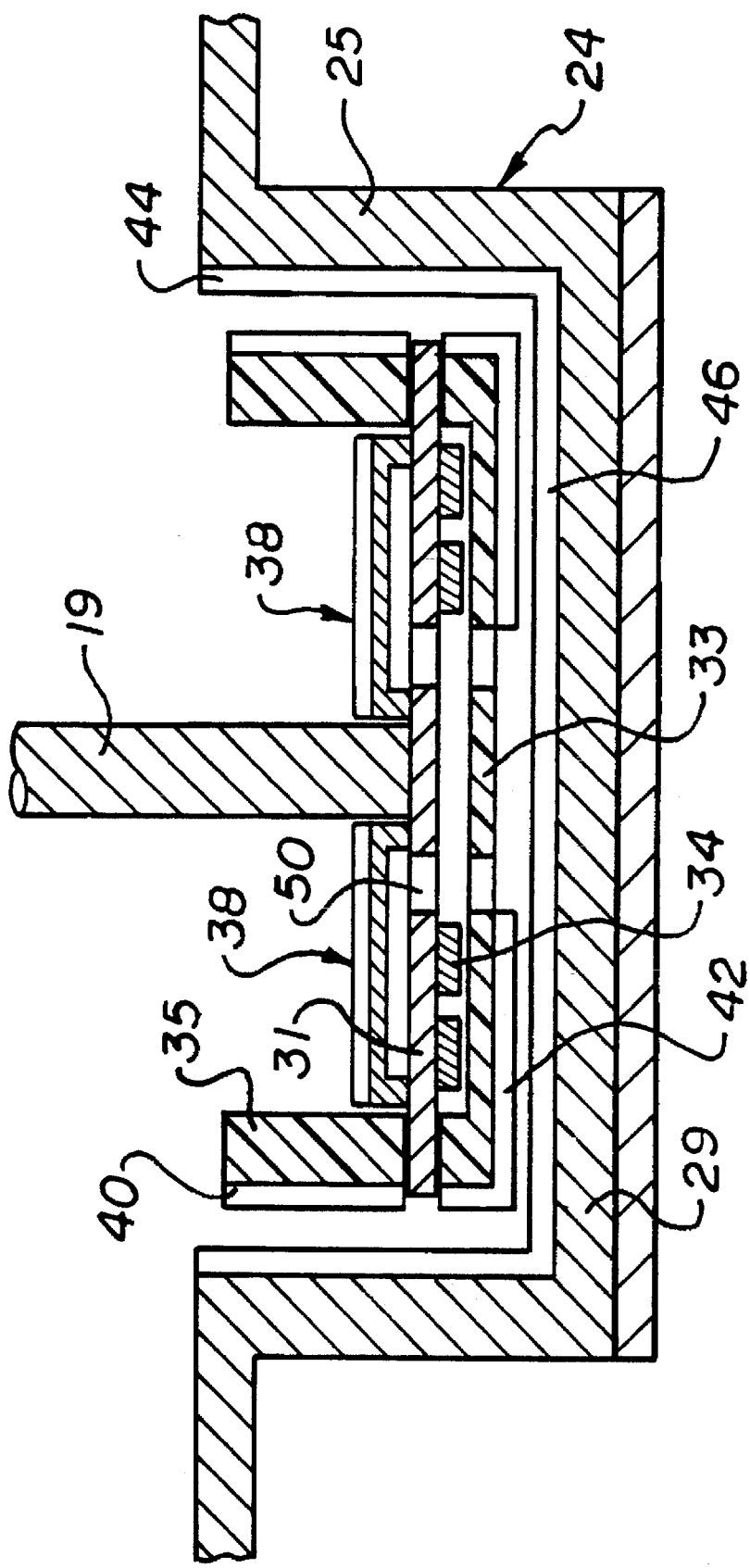
FIG. 2A is a cross-section of a magnetron cathode portion of the present invention in a vacuum chamber of a sputtering device.

A horizontal magnet array fluid control surface 33 is attached to magnet array support plate 31 to cover magnets 34 of the magnet array 32, as shown in cross-section in FIG. 2A. A vertical magnet array fluid control surface 35 is attached to the perimeter of the support plate 31 to extend vertically upward parallel to annular side wall 25 of housing 30. It will be appreciated that by such attachment of non-ferrous or non-magnetic fluid control surfaces to the supporting structure of the magnet array, the principles of the invention can be readily implemented with most existing magnet array cathodes. Thus the use of such fluid control surfaces is not limited to any particular magnet array or housing configuration.

As also illustrated by FIG. 2 and FIG. 2A, horizontal magnet array fluid control surface may include vanes 42 which promote controlled flow of liquid coolant in the housing. Similarly, vertical magnet array fluid control vanes 40 may be provided on the outer periphery of the vertical fluid control surface 35, facing the inner surfaces of annular side wall 25. The vanes attached to the fluid control surfaces of the magnet array also allow a rotated magnet array to perform a secondary pumping function to enhance the flow distribution and circulation of coolant throughout the housing. The fluid control surface vanes also increase the surface area of the magnet array to dissipate more heat when in contact with the coolant. A fluid control surface and vanes may also be provided on top of the magnet array as indicated at 38.

The interior surfaces of the magnet array housing 30 may be similarly provided with fluid control surfaces and/or vanes or grooves. As shown in FIG. 2, magnet array housing vertical vanes 44 are provided on the inner surface of vertical annular side wall 25, facing vertical fluid control vanes 40 of the magnet array. Magnet array housing horizontal vanes 46 are provided on the interior surface of bottom plate 29, facing horizontal fluid control vanes 42 of the magnet array. The vanes attached to the interior surfaces of the housing increase the total surface area of the housing which increases the cooling efficiency of the coolant. Furthermore, the opposing cooperative arrangement of the vanes on the fluid control surfaces of the magnet array and the vanes on the interior walls of the housing act to provide a thorough and even distribution of fluid coolant throughout the magnet array housing and about the magnet array to increase heat transfer away from the cathode material. The fluid control surfaces and vanes are preferably constructed of non-ferrous or non-magnetic material to avoid interference with the magnetic flux generated by the rotating magnet array. Alternatively, the vanes may be formed as grooves in the magnets of the array or as fluid conductive channels between magnets of the array, and/or as patterned grooves machined in the interior surfaces of the magnet array housing.

To allow the coolant to flow into peripheral area 49 between magnet array fluid control surfaces and housing fluid control vanes 44 and 46, the magnet array support plate 31 is provided with throughholes 50 which also act to create turbulence in the coolant, thereby increasing cooling efficiency. The coolant outlet port 37 is positioned above peripheral area 49 to force the coolant to circulate through the magnet area, over the interior surface of bottom plate 29, and up through peripheral area 49. The coolant distribution and circulatory action which the vanes induce reduces pressure at the center of the housing interior, thereby reducing mechanical strain at the interface where the cathode material is bonded to the housing and maintaining the integrity of the bond of the cathode material 36 to bottom plate 29.

Figure 3A:
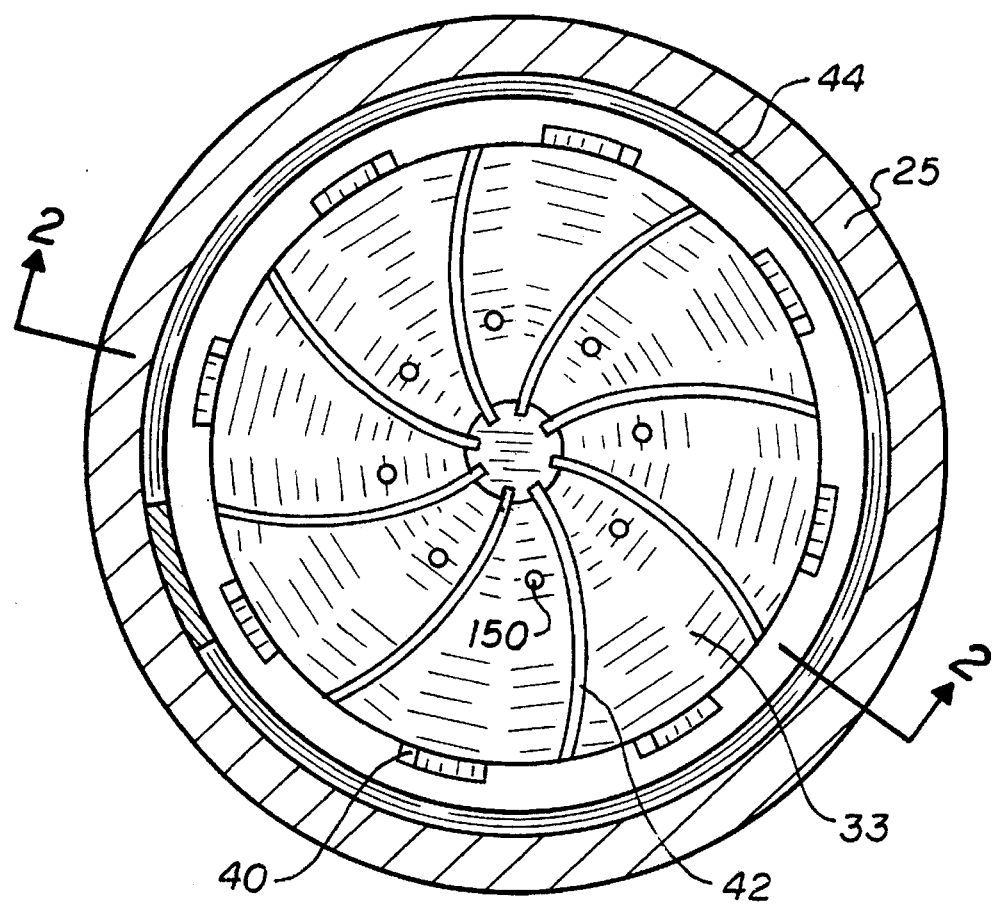
FIG. 3A is an axial view of a magnet array of a magnetron cathode of the present invention.
Figure 4A:
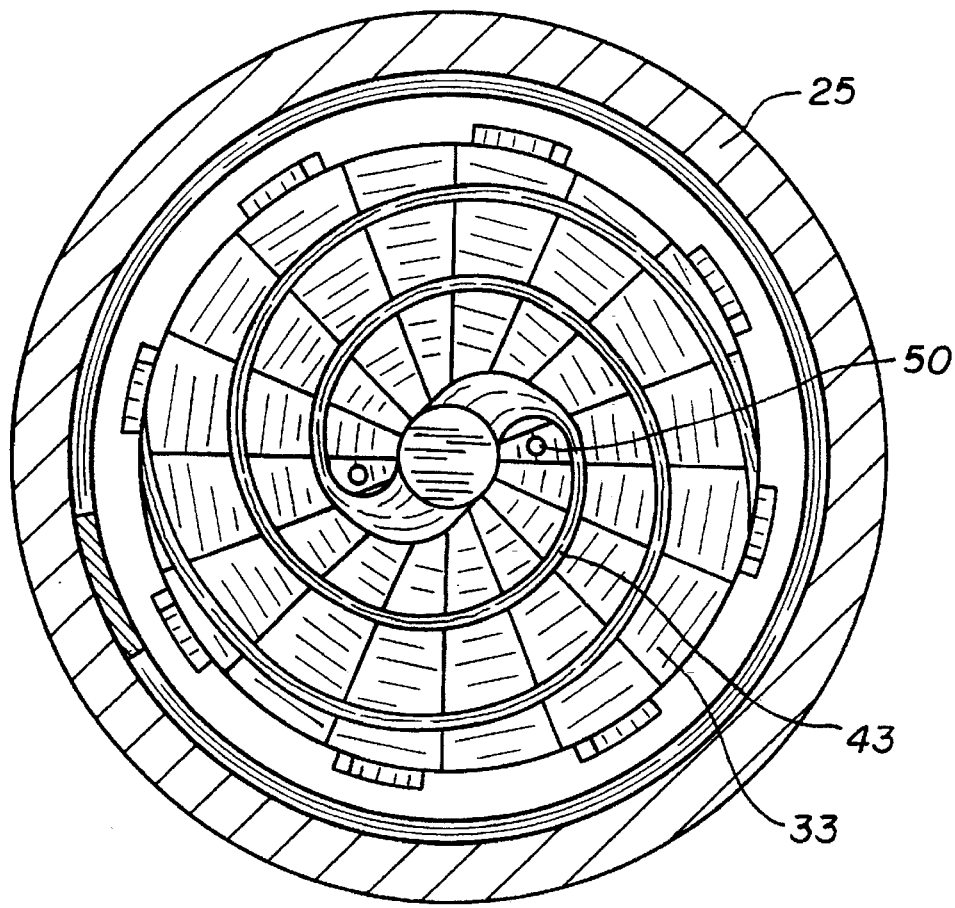
FIG. 4A is an axial view of a magnet array of a magnetron cathode of the present invention.

FIGS. 3A and 4A illustrate axial views of alternate embodiments of horizontal magnet array fluid control surfaces and vanes. In both embodiments, the generally circular axial profile of the magnet array 32 and horizontal fluid control surface 33 covering the magnet array 32 is dimensioned to occupy most of the magnet array housing but with sufficient peripheral clearance for vertical fluid control vanes 40 to extend radially outward from the periphery of vertical fluid control surface 35. Alternate arrangements of coolant passage throughholes 50 in magnet array support plate 31 are also illustrated. Coolant passage throughholes 50 allow and promote flow of coolant through the magnet array into direct contact with bottom plate 29, an area of high heat concentration in the cathode assembly. The curvilinear radial arrangement of horizontal magnet array fluid control vanes 42 shown in FIG. 3A would of course induce flow and turbulence patterns of the coolant different than the spiral arrangement of horizontal magnet array fluid control vanes 43 of FIG. 4A. The particular configuration of the fluid control surfaces and vanes thereon will depend upon many different factors including, for example, the size and configuration of the magnet array and housing, the position of the magnet array relative to the housing, speed of rotation of the magnet array, rate of pumping of coolant, coolant density, etc.

Figure 3B:
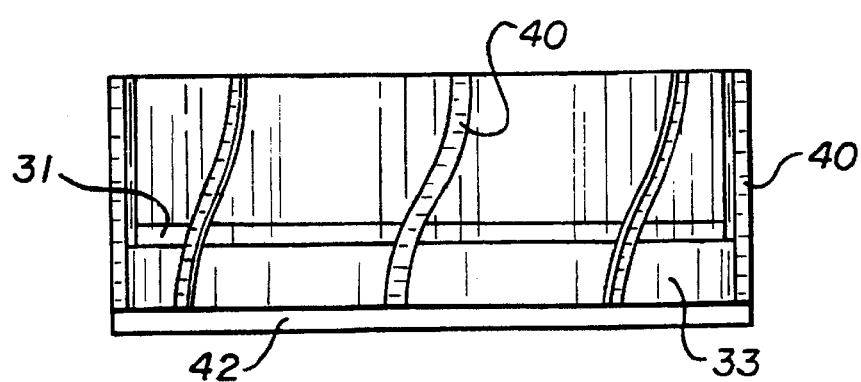
FIG. 3B is a side elevation view of a magnet array of a magnetron cathode of the present invention.
Figure 4B:
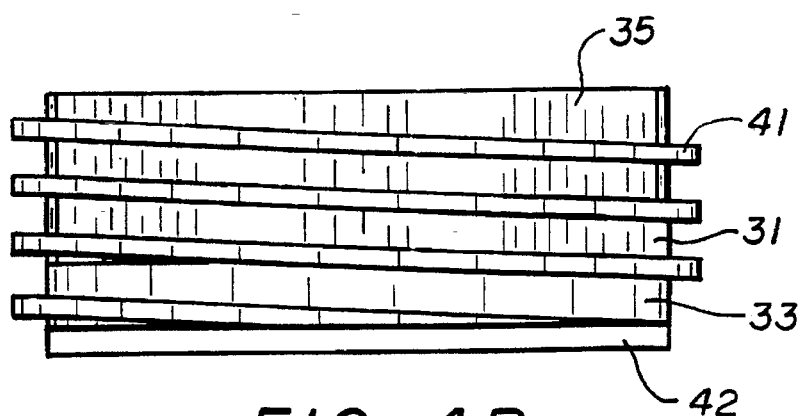
FIG. 4B is a side elevation view of a magnet array of a magnetron cathode of the present invention.

FIGS. 3B and 4B illustrate respectively side views of alternate embodiments of vertical fluid control surfaces 35 and vanes 40 and 41 which may be attached to the magnet array support plate in corresponding relationship with the horizontal magnet array fluid control surfaces and vanes of FIGS. 3A and 4A. Again, the particular arrangement and orientation of the vertical fluid control surfaces and vanes will of course directly affect coolant flow and cooling efficiency such that an optimum vane arrangement may be adapted for any particular cathode assembly.

Figure 5:
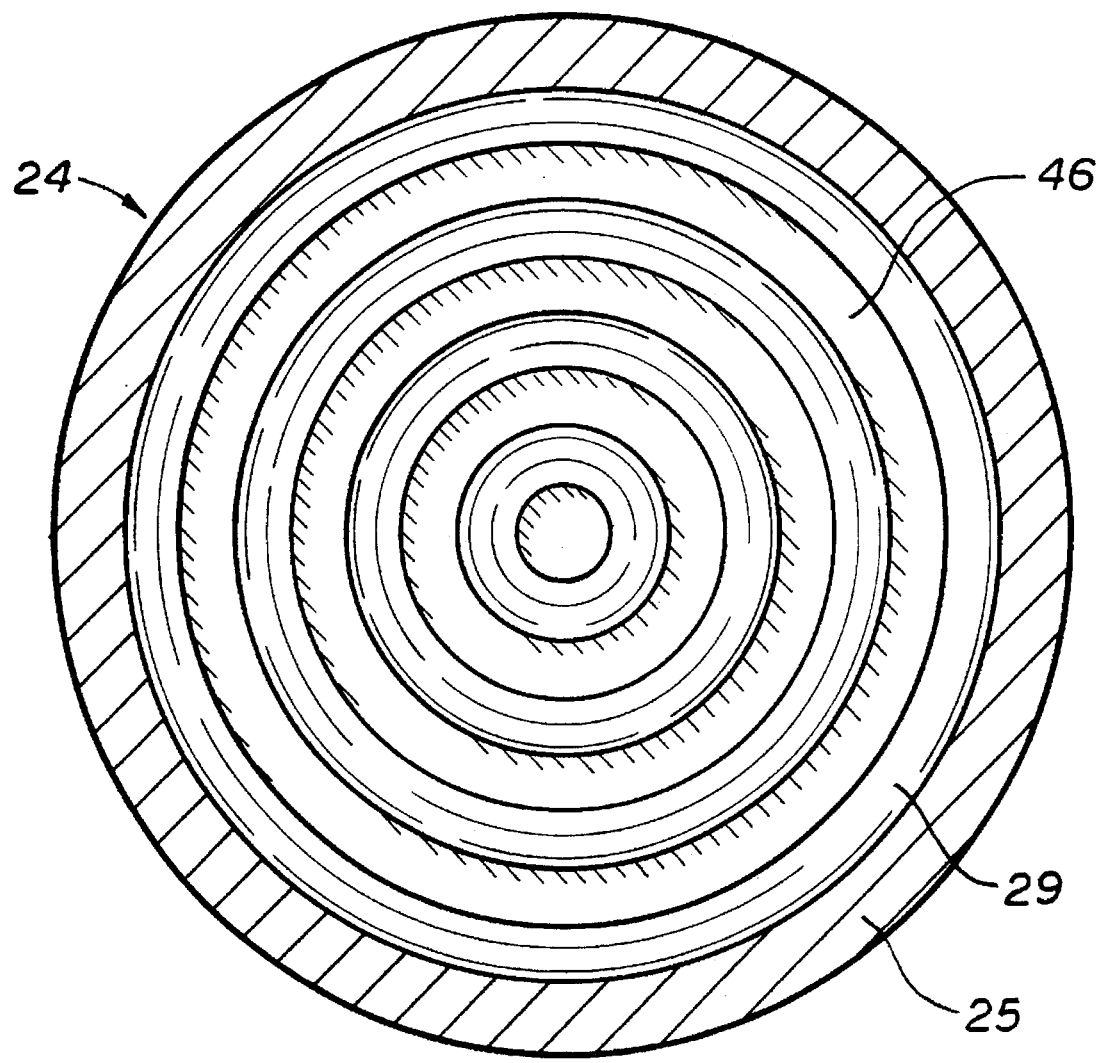
FIG. 5 is a plan view of an of an interior surface of a magnet array housing of the present invention.

FIG. 5 illustrates an embodiment of magnet array housing horizontal fluid control vanes 46, on the interior surface of bottom plate 29, which act to promote heat dissipation from vacuum mount flange 24, and to cooperate with the magnet array horizontal fluid control vanes 42 to promote flow and circulation of coolant throughout the housing to increase cooling action upon the cathode.

Figure 6:
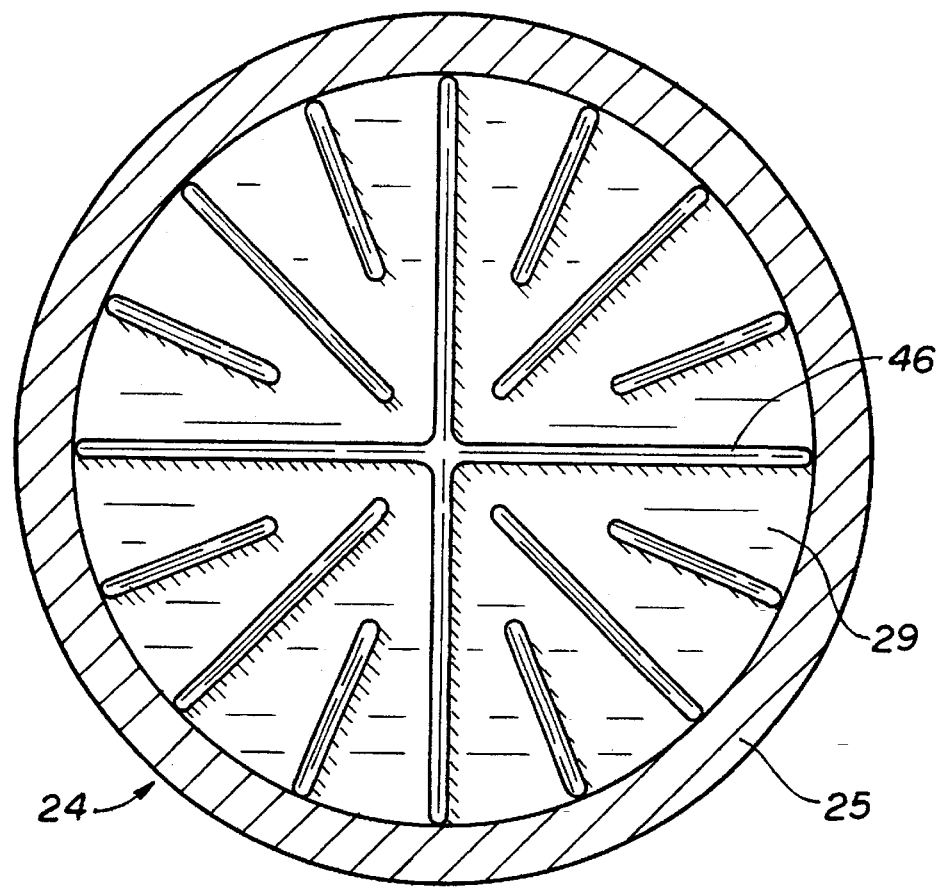
FIG. 6 is a plan view of an alternate embodiment of an interior surface of a magnet array housing of the present invention.

FIG. 6 illustrates an alternate embodiment of magnet array housing horizontal fluid control vanes 47.

Figure 7:
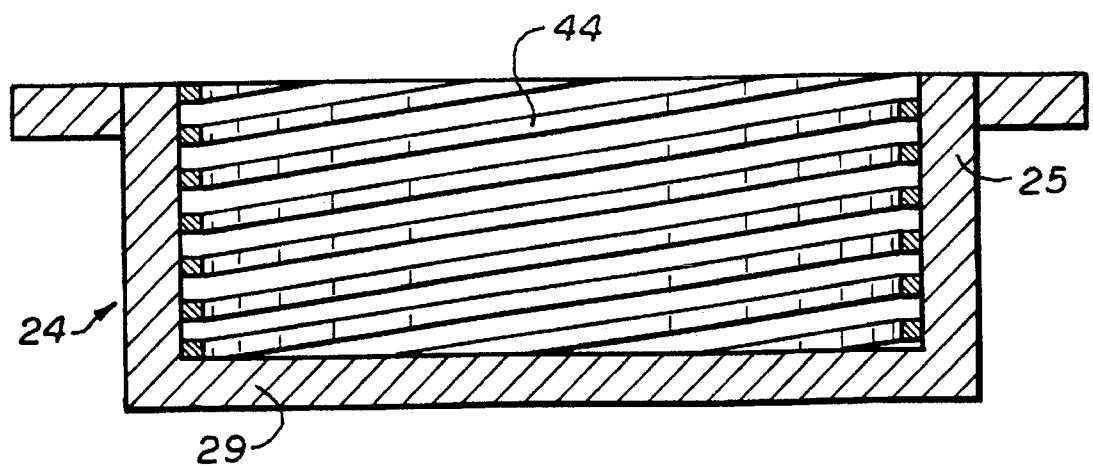
FIG. 7 is an elevation of an interior side of a side wall of a magnet array housing of the present invention.

FIG. 7 illustrates from the side an embodiment of magnet array housing vertical fluid control vanes 44, on the interior of annular side wall 25, which also function to promote heat dissipation from the housing and cooperate with vertical magnet array fluid control vanes 40 to promote dynamic flow and/or turbulence of coolant through the housing and about the magnet array.

Figure 8:
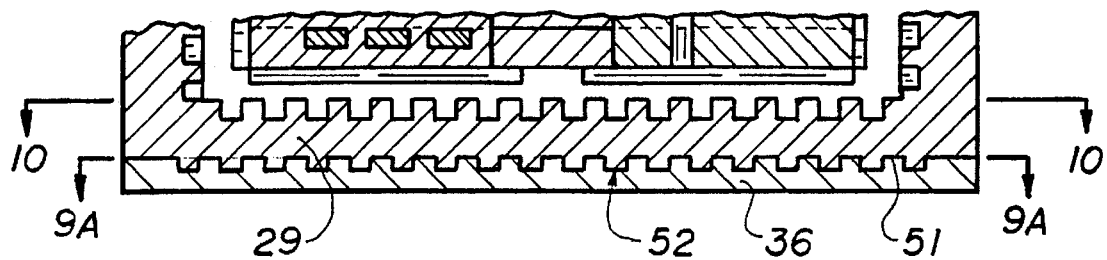
FIG. 8 is a cross-sectional view of a portion of magnetron cathode of the present invention.
Figure 9A:
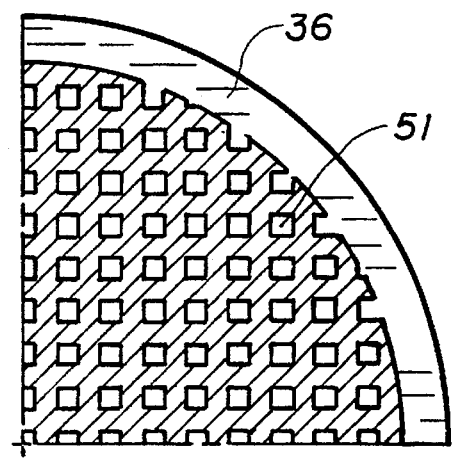
FIG. 9 is a plan view of a portion of the interior of the housing of FIG. 8, taken in the direction of arrows 9—9 in FIG. 8.
Figure 9B:
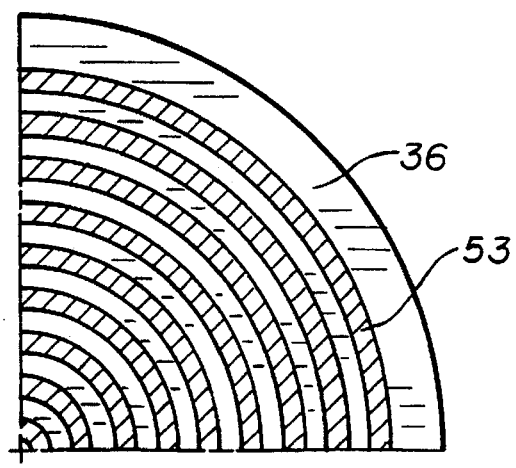

FIG. 8 illustrates an alternate embodiment of the invention wherein the interfacing surfaces of cathode material 36 and housing bottom plate 29 are machined in a non-flat configuration which increases heat transfer efficiency away from the bonding layer of the cathode material. The upper surface of cathode material 36 can be machined in a waffle iron pattern to form multiple elevated sectors 51, shown from above in FIG. 9A, which fit within an oppositely machined pattern 52 in a bottom surface of housing bottom plate 29. An adhesive material, such as a suitable solder glue alloy is applied over these interfacing surfaces which transfer heat away from the adhesive material more efficiently than does two abutting flat surfaces. Any mating surfaces of a geometry more complex than flat surfaces may be used to improve heat transfer from this region in accordance with the principles of the invention. For example, FIG. 9B illustrates a circular pattern 53 which could be machined in an upper surface of the cathode material with a corresponding circular mating surface formed in the bottom of housing bottom plate 29. Other non-flat geometries to the mating surfaces, such as pyramids, rounded protrusions, rods, or mounds, with corresponding mating indentations in the opposing surface, are of course possible.

Figure 10:
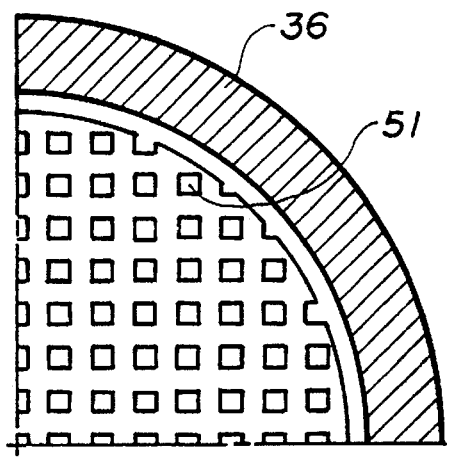
FIG. 10A is a plan view of a portion of the cathode plate of FIG. 8, taken in the direction of arrows 10A—10A in FIG. 8.
FIG. 10B is a plan view of a portion of an alternate embodiment of a cathode plate of the present invention.

As shown in FIG. 10, the internal surface of the cathode housing bottom plate 29 may be similarly machined in a non-flat configuration such as raised sectors 51 also to increase the surface area of contact for the coolant to improve cooling efficiency.

Thus a high power capacity magnetron cathode assembly is disclosed which has significantly improved cooling characteristics achieved by the use of coolant fluid control vanes on the magnet array and inside the magnet array housing. Cooling at the interface of the cathode material to the magnet array housing is particularly improved, allowing greater power to be applied to the cathode without jeopardizing the bonding of the cathode material.

Although the invention has been disclosed and described with respect to certain preferred embodiments, alterations and variations to structures which employ the principles of the invention, such as different configurations of the magnet array and magnet array housing fluid control vanes, may occur to those of ordinary skill in the art. All such alterations and variations are within the purview of this invention, the scope of which is defined for now by the claims and equivalents.

What is claimed is:

1. A fluid cooled magnetron cathode and pumping assembly for use in combination with a sputtering device comprising:

a magnet array positioned in a magnet array housing in a vacuum chamber of the sputtering device, the magnet array connected to a power driven drive shaft for rotating the magnet array within the housing, the magnet array housing including cathode material, the magnet array housing having a coolant inlet port connected to a fluid coolant supply and a coolant outlet port whereby coolant can be circulated through the magnet array housing, a fluid control surface in the form of vanes attached to and extending from a planar surface of the magnet array, said vanes operative to control flow of coolant introduced into the magnet array housing.

2. The magnetron cathode assembly of claim 1 wherein the fluid control surface is attached to a bottom surface of a supporting structure of the magnet array.

3. The magnetron cathode assembly of claim 1 wherein the fluid control vanes are operative to pump coolant fluid through the magnet array housing as the magnet array is rotated within the magnet array housing.

4. The magnetron cathode assembly of claim 1 wherein the fluid control surface extends in a direction perpendicular to a plane of the magnet array.

5. The magnetron cathode of claim 1 wherein the fluid control surface is on a top surface of the magnet array.

6. The magnetron cathode of claim 1 wherein the fluid control surfaces include coolant passage holes aligned with coolant passage holes in a magnet array support plate.

7. The magnetron cathode of claim 1 wherein the coolant outlet port is positioned between a peripheral edge of fluid control surfaces of the magnet array and a side wall of the magnet array housing.

8. The magnetron cathode of claim 1 including coolant passage holes in a supporting structure of the magnet array, said coolant passage holes positioned between vanes on said fluid control surface.

9. The magnetron cathode of claim 1 wherein the fluid control surfaces of the magnet array are comprised of non-magnetic material.

10. The magnetron cathode of claim 1 wherein the fluid control surfaces of the magnet array are comprised of non-metallic material.

11. The magnetron cathode assembly of claim 1 wherein the magnet array housing further comprises grooves in interior surfaces of the housing.

12. The magnetron cathode assembly of claim 1 wherein the magnet array housing further comprises fluid control vanes on interior surfaces of the housing.

13. The magnetron cathode assembly of claim 1 wherein the magnet array housing is constructed of cathode material.

14. The magnetron cathode assembly of claim 1 further comprising cathode material integrally bonded to an exterior surface the magnet array housing by interlocking engagement of cooperating non-planar surfaces of the cathode material and an exterior surface of the magnet array housing.

15. A rotatable magnet array for use in a liquid-cooled cathode assembly of a sputtering device, the rotatable magnet array having a plurality of magnets rotatably mountable in a magnet array housing having a coolant inlet port and a coolant outlet port, the rotatable magnet array having fluid control vanes attached to a supporting structure of the magnet array.

16. The rotatable magnet array of claim 15 wherein said fluid control surface covers the supporting structure of the magnet array.

17. The rotatable magnet array of claim 16 wherein the magnet array housing comprises fluid control vanes.

18. The rotatable magnet array of claim 15 wherein said fluid control surface vanes project from a surface of the fluid control surface.

* * * * *